(12) United States Patent
Leung et al.

(10) Patent No.: US 6,307,497 B1
(45) Date of Patent: *Oct. 23, 2001

(54) PROGRAMMABLE GAIN ADC

(75) Inventors: Ka Y. Leung; Douglas S. Piasecki, both of Austin, TX (US)

(73) Assignee: Cygnal Integrated Products, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/638,095

(22) Filed: Aug. 11, 2000

Related U.S. Application Data

(62) Division of application No. 09/595,959, filed on Jun. 19, 2000.

(51) Int. Cl.⁷ .................................................. H03M 1/16
(52) U.S. Cl. .......................................... 341/155; 341/139
(58) Field of Search ..................... 341/155, 159, 341/144, 139

(56) References Cited

U.S. PATENT DOCUMENTS

| | | | |
|---|---|---|---|
| 4,338,591 | 7/1982 | Tuthill | 340/347 |
| 5,220,483 | 6/1993 | Scott | 361/313 |
| 5,343,199 | 8/1994 | Sugawa | 341/159 |
| 5,499,027 | 3/1996 | Karanicolas et al. | 341/120 |
| 5,581,252 | 12/1996 | Thomas | 341/144 |
| 5,703,588 | 12/1997 | Rivoir et al. | 341/159 |
| 6,043,767 | 3/2000 | Wakamatsu | 341/139 |
| 6,150,968 | 11/2000 | Tsay et al. | 341/139 |

OTHER PUBLICATIONS

A Monolithic Charge–Balancing Successive Approximation A/D Technique, Thomas P. Redfern, Joseph J. Connolly, Jr., Sing W. Chin and Thomas M. Frederiksen, *IEEE J. Solid State Circuits*, vol SC–14, pp. 912–920, Dec. 1979.

"High Resolution A/D Conversion in MOS/LSI"; Bahram Fotouhi and David A. Hodges; *IEEE J. Solid State Circuits*, vol. SC–14, pp. 920–926, Dec. 1979.

"Technological Design Considerations for Monolithic MOS Switched–Capacitor Filtering Systems", David J. Allstot and William C. Black, Jr., *Proc. IEEE*, vol. 71, pp. 967–968, Aug. 1983.

"Error Correction Techniques for High–Performance Differential A/D Converters", Khen–Sang Tan, Sami Kiriaki, Michiel De Wit, John W. Fattaruso, Ching–Yuh Tsay, W. Edward Matthews and Richard K. Hester; *IEEE J. Solid State Circuits*, vol. 25, No. 6, Dec., 1990.

"A 12–b 5–MSample/s Two–Step CMOS A/D Converter", Behzad Razavi and Bruce A. Wooley, *IEEE J. Solid State Circuits*, vol. 27, No. 12, Dec. 1992.

"An IEEE 1451 Standard Transducer Interface Chip with 12–b ADC, Two 12–b DAC's, 10–kB Flash EEPROM, and 8–b Microcontroller", Tim Cummins, Eamonn Byrne, Dara Brannick and Dennis A. Dempsey, *IEEE J. Solid State Circuits*, vol. 33, No. 12, Dec. 1998.

*Primary Examiner*—Brian Young
(74) *Attorney, Agent, or Firm*—Howison, Chauza, Thoma, Handley & Arnott, L.L.P.

(57) ABSTRACT

A programmable gain circuit for analog-to-digital converter. A switched capacitor network capacitively couples an analog reference from a DAC to a comparator so that the sampled amplitude of the input analog signal can be compared with said analog reference. The ratio of the capacitance of the sampling capacitor to that of the switched capacitor network establishes an effective gain to the analog signal being converted.

21 Claims, 2 Drawing Sheets

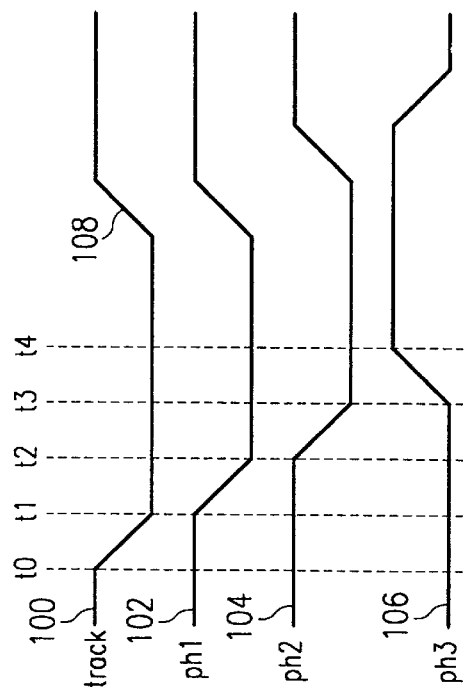
FIG. 2
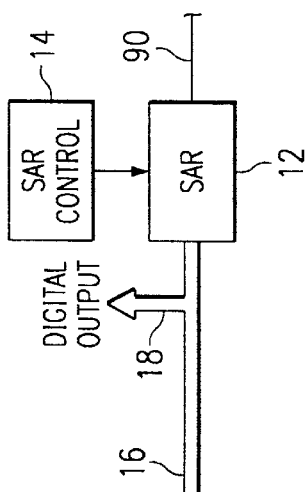
FIG. 3
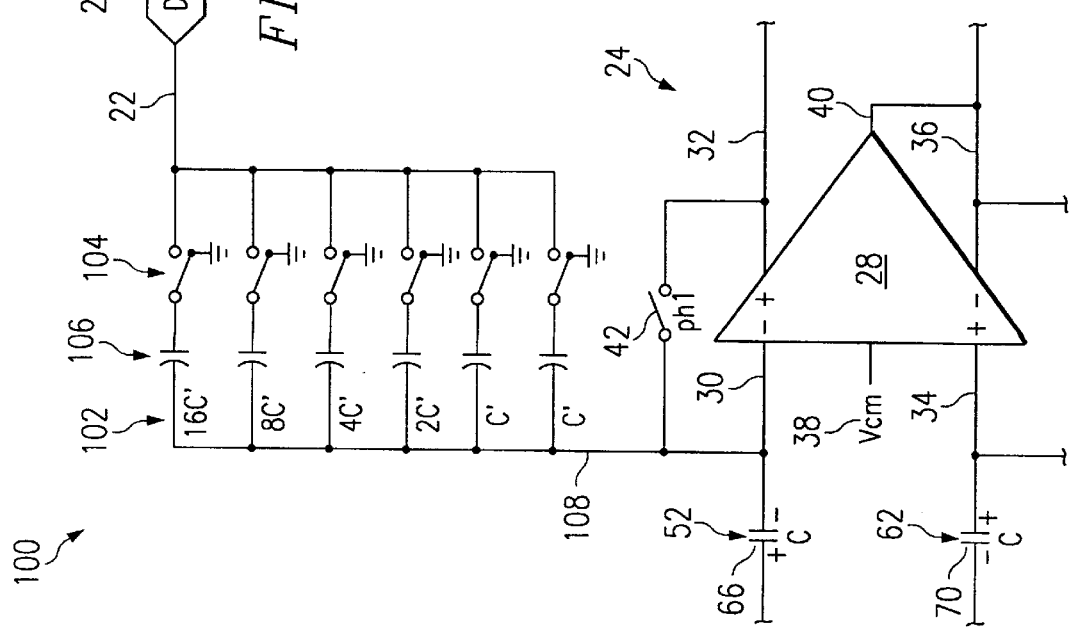

PROGRAMMABLE GAIN ADC

RELATED APPLICATIONS

This patent application is a divisional of pending U.S. Patent Application entitled DIFFERENTIAL/SINGLE ENDED ANALOG-TO-DIGITAL CONVERTER, Ser. No. 09/595,959, filed Jun. 19, 2000, the subject matter of which is incorporated herein by reference, and is related to U.S. Patent application entitled COMPARATOR-AMPLIFIER CONFIGURATION IN AN ADC, filed herewith.

TECHNICAL FIELD OF THE INVENTION

The present invention relates in general to analog-to-digital converters, and more particularly to converters adapted for providing gain to input analog signals.

BACKGROUND OF THE INVENTION

Although a substantial portion of signal processing is carried out with digital circuits, there are many applications that require the generation and a processing of analog signals. When mixed signal processing is involved, it is a common practice to convert the analog signals to corresponding digital signals for processing by a microprocessor, or the like. Indeed, many microprocessor chips are commercially available with on-board analog-to-digital converters (ADC's). The particular type of analog signals themselves utilized may require different types of conversion circuits and techniques. For example, various circuits generate analog signals on a single conductor, referenced with respect to ground. This type of signal is known as "single ended", meaning that the magnitude of the signal is measured with respect to a known reference voltage, such as ground. Other circuits generate differential analog signals on a pair of conductors. One analog signal on one conductor is measured with respect to the other conductor, and not with respect to a circuit ground. Such type of signals can be generated by transformers, differential output amplifiers as well as many other circuits.

The design and construction of an ADC for converting signal-ended signals is less complex than that of ADC devices for converting differential signals. It is not uncommon for a differential ADC to include two main capacitor arrays, two sets of analog switches, a differential comparator and successive-approximation logic. There are also many situations in which single-ended and differential signals are available, and it would be desirable to employ a single ADC for processing both types of signals.

From the foregoing, it can be seen that a need exists for an analog-to-digital converter that can process both single-ended and differential analog signals. Another need exists for an ADC that is efficient in design, and does not require duplicated circuits for processing differential-type analog signals. Yet another need exists for an ADC design that can be configured to convert both differential and single-ended analog signals without compromising the dynamic range of the ADC device. It would also be desirable to provide an ADC device that includes a comparator that can be configured as a high gain operational amplifier, and can be operated with a lower gain so that the comparator operates at a high speed. Another need exists for utilizing plural low gain stages to provide an overall high gain and high speed operation. Another need exists for an improved ADC that provides an efficient programmable gain circuit.

SUMMARY OF THE INVENTION

In accordance with the principles and concepts of the invention, there is disclosed an analog-to-digital converter for processing both single-ended and differential type of analog signals. The disclosed embodiment of the ADC can process both types of analog signals without compromising the dynamic range of the converter.

In accordance with the disclosed embodiment of the invention, a single digital-to-analog converter is employed with the ADC to process both differential and single-ended signals. The capacitor inputs to a high speed comparator can be switched to store a sample of a differential input signal, and then switched so as to be placed in series, and then combined with a SAR-generated analog reference. The series-connected input capacitors can share the sampled charge of the +/− full scale differential signals and utilize the full dynamic range of the ADC device. When configured for single-ended operation, only one input capacitor is utilized with the full scale single-ended analog voltage to utilize the full dynamic range of the ADC device.

An operational amplifier is utilized in the disclosed ADC device, and configured as a high precision unity gain amplifier with a very high open-loop gain to sample the analog input voltage on the input capacitors, and reconfigured to provide an open loop, moderate gain comparator to provide a high speed and high resolution of whether the input analog voltage(s) is greater or less than the SAR-generated analog reference. To provide even higher gain comparator operation, plural moderate-gain amplifiers provide additional high speed amplification to the comparator output.

In another embodiment, programmable gain can be provided in the ADC device by utilizing different-valued capacitors switched in parallel with capacitors driven by the digital-to-analog converter. By employing charge-sharing between the input capacitors and the programmable gain capacitors, an effective change in the gain of the ADC can be realized.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts or elements throughout the views, and in which:

FIG. 2 is a set of electrical waveforms illustrating the timing of the various circuits of the ADC of FIG. 1; and FIG. 3 illustrates the alternative circuits for providing programmable gain to the ADC of FIG. 1.

DETAILED DESCRIPTION OF THE INVENTION

Figure 1:
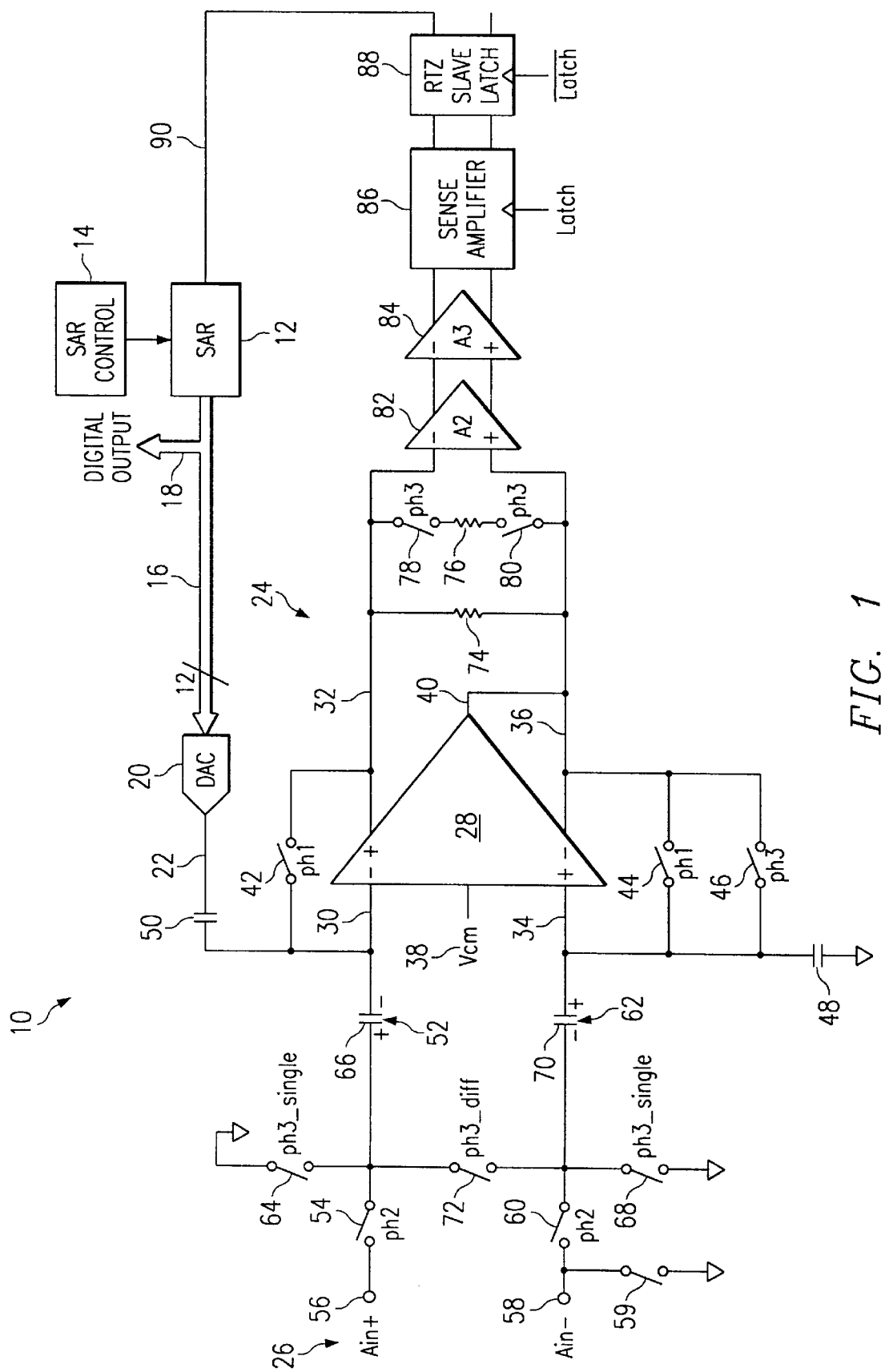
FIG. 1 is a detailed electrical schematic diagram of the ADC constructed according to one embodiment of the invention.

The ADC device 10 illustrated in FIG. 1 is adapted for utilizing the same circuits in the conversion of both differential and single-ended analog signals. The converter 10 is of the type utilizing successive approximation circuits for generating an analog reference voltage for comparing with the input analog voltage to be converted. To that end, the ADC 10 includes a successive approximation register and associated circuits 12 of the type that is well known in the field. A successive approximation register control 14 controls the SAR 12 in a traditional manner to generate a N-bit digital word on the output 16. In the preferred form of the invention, a 12-bit word is generated on bus 16. The 12-bit bus 16 provides the digital output 18 of the ADC device 10.

The digital word produced by the successive approximation register 12 is also coupled on bus 16 to a digital-to-analog converter (DAC) device 20. The DAC device 20 can be of conventional design for converting N-bit digital signals to a corresponding analog reference signal on output 22. Briefly, the operation of the successive approximation register 12 is described as follows. A counter register known as a SAR register in the SAR 12 is reset so that all bits are zero, except the most significant bit (MSB). The DAC 20 produces a corresponding analog reference signal that is compared by the comparator circuit 24 with an analog signal provided at the device input 26. Depending on the logic state of the output of the comparator circuit 24, the most significant bit of the initial digital word remains a logic 1, or is reset to a logic 0. The next significant bit of the counter in the SAR 12 is then set and another iteration is carried out to determine if the analog input signal to be converted is greater or less than the corresponding analog reference signal generated by the DAC device 20. The process is repeated down to the least significant bit (LSB), at which time the counter register in the SAR 12 provides the resultant digital word on bus 16 as an output 18 for the ADC device 10.

The comparator portion 24 of the ADC device 10 includes a differential input, differential output type of operational amplifier 28. As will be described below, the comparator circuit 24 is configured as a unity feedback amplifier with high open-loop gain to sample the analog input signals, and reconfigurable with a lower gain to function as a high speed comparator. The comparator 28 includes an inverting input 30 and a corresponding noninverting output 32. In like manner, a noninverting input 34 and corresponding inverting output 36 are provided by the comparator 28. A common mode reference voltage 38 is coupled to the comparator 28. A common mode output 40 of the comparator 28 is coupled to the inverting output 36, the operation of which will be described below. Coupled between the inverting input 30 and noninverting output 32 of the comparator 28 is a semiconductor switch 42. In practice, the switch 42 can be one or more transistor switches controlled by a phase 1 clock signal, designated ph1. In like manner, the noninverting input 34 and inverting output 36 of the comparator 28 have coupled therebetween a corresponding phase 1 switch 44. Connected in parallel with the phase 1 switch 44 is a phase 3 switch 46. A capacitor 48 is connected between the noninverting input 34 of the comparator 28, and ground. The capacitor 48 provides impedance matching on the noninverting input 34 of the comparator 28 to balance the capacitance of capacitor 50 coupled to the output 22 of the DAC device 20.

The inverting input 30 of the comparator 28 is coupled through a series input capacitor 52 to a phase 2 switch 54. The phase 2 switch 54 is coupled to the $A_{in}+$ analog input 56 of the ADC device 10. Similarly, the other differential input $A_{in}-$ 58 is coupled through a phase 2 switch 60 and a series input capacitor 62 to the noninverting input 34 of the comparator 28. At the junction between the phase 2 switch 54 and the series input capacitor 52 associated with the inverting input 30, is a phase 3 switch 64 which, when operated, connects the plate 66 of input capacitor 52 to ground. Another phase 3 switch 68 is coupled to the junction of the phase 2 switch 60 and the input capacitor 62, and ground. When operated, the switch 68 grounds one plate 70 of input capacitor 62. Phase 3 switches 64 and 68 are operated only in the single-ended operation of the ADC device 10. Lastly, a phase 3 switch 72 is connected between the differential input conductors so that when operated, a short circuit is placed between the plates 66 and 70 of respective capacitors 52 and 62. The phase 3 switch 72 is operated only during differential operation of the ADC device 10. The various switches are controlled by clock signals, as shown in FIG. 2.

A gain-determining resistor 74 is coupled between the noninverting output 32 and inverting output 36 of the comparator 28. The value of gain-setting resistor 74 is selected to provide nominal gain of about ten thousand to the comparator 28 when configured as an amplifier. The second gain-determining resistor 76 is connected at its ends by way of respective phase 3 switches 78 and 80 between the noninverting output 32 and inverting output 36 of the comparator 28. When the phase 3 switches 78 and 80 are operated, the resistor 76 is placed in parallel with resistor 74, thereby reducing the gain of the comparator 28. The gain of the comparator 28 is about ten when configured as a comparator. As will be described below, the purpose for this is that while the gain is reduced, the speed of the comparator 28 is increased, thereby providing high speed conversions of analog signals to corresponding digital signals.

The noninverting output 32 and noninverting output 36 of the comparator 28 are coupled to the differential inputs of a second amplifier stage 82. The differential outputs of the amplifier stage 82 are coupled to the corresponding differential inputs of a third amplifier stage 84. The amplifiers 82 and 84 are each configured with respective gains of about six. The differential outputs of the second amplifier 84 are coupled to a conventional sense amplifier 86 constructed much like that utilized in a typical DRAM memory. The sense amplifier 86 is controlled by a latch signal generated by the SAR control 14. The differential outputs of the sense amplifier 86 are coupled to the return-to-zero (RTZ) slave latch 88. The slave latch 88 is much like a set-reset type of latch well known in the art. The slave latch 88 is controlled by a latch signal generated by the SAR control 14. The set output 90 of the slave latch 88 is coupled to the successive approximation register circuit 12.

With reference to FIG. 2, there is illustrated the timing waveforms generated by the SAR control 14 and utilized to control the various phase 1, phase 2 and phase 3 switches identified above. A track signal 100 can be applied to the ADC device 10 by a user to commence the conversion process of analog signals to corresponding digital signals. As illustrated, the track signal 100 is driven to a logic low at time $T_0$ to initiate the 12-bit conversion process which continues until the track signal 100 returns to a logic high level shown by rising edge 108. A phase 1 clock signal 102 is driven to a logic low between times $T_1$ and $T_2$ to open the phase 1 switches 42 and 44. When driven to a logic high level, the phase 1 signal 102 maintains the corresponding switches 42 and 44 closed. At times $T_2$, a phase 2 signal 104 is driven to a logic low to open the corresponding switches 54 and 60. During the logic high levels of the phase 2 signal 104, the switches 54 and 60 are closed, thereby allowing the input capacitors 52 and 62 to charge to respective voltages corresponding to the analog inputs. Lastly, a phase 3 signal 106, which is initially at a logic low level, is driven to a logic high level at time $T_3$. At time $T_4$, the phase 3 signal 106 is at a logic high level, thereby closing the respective switches 46, 64, 68, 72, 78 and 80. As noted in FIG. 2, the phase 1 clock signal 102, phase 2 clock signal 104 and phase 3 clock signal 106 return to their initial logic levels after the track signal 100 has returned to its high state, indicating termination of the conversion process.

As will be described in detail below, when an optional switch 59 associated with the noninverting input 34 of the comparator 28 is closed, the ADC device 10 functions to convert single-ended analog signals to corresponding digital signals. Otherwise, when switch 59 is open, differential analog signals can be applied to inputs 56 and 58 of the ADC device 10. The operation of the ADC device 10 will first be described in conjunction with the conversion of differential analog signals coupled to the device. For purposes of example only, it is assumed that a differential voltage of +5 volt is applied to input 56 and −5 volts is applied to input 58. It is further assumed that the common mode output 40 of the comparator 28 maintains the inverting output 36 at about a 0 volt level. In the described embodiment of the invention, the conversion cycle noted in FIG. 2 takes place in about 400 nanoseconds for each of the twelve bits. Accordingly, in order to provide a conversion of the input analog signal to the corresponding 12-bit word takes in the neighborhood of about 4.8 microseconds.

Because the phase 1 signal 102 is initially at a logic high level prior to time $T_1$, the feedback switches 42 and 44 are closed, thereby forcing the comparator 28 to operate as a closed-loop, unity gain operational amplifier with an open loop gain of about ten thousand. Additionally, when phase 1 switch 44 is closed, a common mode voltage of about 0 volts is applied from the inverting output 36 to the noninverting input 34. One plate of input capacitor 62 is thus maintained at the common mode voltage of 0 volts. When phase 1 switch 42 is closed, any offset voltage of the comparator 28 is captured at the inverting input 30. Thus, the plate of the series input capacitor 52 is maintained at the offset voltage. By initially maintaining one plate of the input capacitor 52 at the offset voltage of the comparator 28, the effects of such offset voltage do not adversely affect the conversion process, especially with the least significant bits. This process of capturing the comparator offset of the capacitor is known as an auto-zeroing process. Once the comparator 28 is configured as an operational amplifier at time times $T_1$, the phase 2 switches 54 and 60 close between times $T_1$ and times $T_2$. Differential analog voltages applied to the differential inputs 56 and 58 are thus coupled to respective plates 66 and 70 of series input capacitors 52 and 62. As noted above, input capacitors 52 and 62 are of essentially the same capacitance value. As an example, if +5 volts is applied to input 56 and −5 volts is applied to input 58, capacitors 52 and 62 will charge with the polarities shown in FIG. 1.

Between times $T_3$ and times $T_4$ (FIG. 2), the phase 3 signal 106 driven to a logic high level, thereby closing switches 46, 72, 78 and 80. It is noted that during this time, phase 1 switches 42 and 44 are open, and the phase 2 switches 54 and 60 are also open. Once the series input capacitors 52 and 62 are charged to voltages corresponding to the input analog voltages, the gain of the comparator 28 is reduced when a new gain-setting resistor 76 is bridged across the other gain-determining resistor 74. The gain is reduced from about ten thousand to a factor of about ten, thereby increasing the speed of the comparator 28. This is due to the constant gain bandwidth product of operational amplifiers. Importantly, the closing of phase 3 switch 72 short circuits the plate 66 of input capacitor 52 to the plate 70 of input capacitor 62. It is noted that when the phase 3 switch 46 is closed, the common mode voltage (0 volts) is maintained at the noninverting input 34 of the comparator 28. When the phase 3 switch 72 closes, the voltage at the noninverting input 34 of the comparator 28 remains the same, i.e., at about 0 volts, while the inverting input 30 goes to a voltage of about −10 volts+$V_{offset}$. The differential output voltage of the comparator 28 is applied the second amplifier stage 82 which, in turn, has the output differential voltage thereof applied to the third amplifier stage 84. Depending on the polarity of the differential voltage at the output of the third amplifier stage 84, the sense amplifier 86 is latched to either a logic 0 or a logic 1 output. The slave latch 88 stores the digital signal, and applies the same to an input of the SAR 12.

The SAR control 14 controls the SAR 12 to produce a 12-bit digital signal according to standard operation of such type of circuits. The 12-bit word is applied on bus 16 to the DAC 20, which produces a corresponding analog signal on output 22. In one embodiment of the invention, the capacitor 50 is of the same value as the series input capacitors 52 and 62. Stated another way, the composite capacitance value of series-connected input capacitors 52 and 62 is one-half that of the individual capacitors 52 or 62. The analog reference voltage generated by the DAC 20 thus need only be one-half of the voltage that exists at the inverting input 30 of the comparator 28. Thus, in order to offset the composite analog voltage at the inverting input 30 of the comparator 28, the analog reference voltage generated at the DAC output 22 need only be half of the voltage on the inverting input 30. This is a result of the charge that is shared between capacitors 50, 52 and 62.

In any event, as will be described below, by providing a variable capacitor in lieu of capacitor 50, the effective gain of the ADC device 10 can be programmably changed. By successively generating digital words by the SAR 12, and producing corresponding analog signals for comparing with the input analog signal, the various digital bits are generated such that overall digital word is equivalent to the input analog differential voltage.

With regard to the single-ended operation of the ADC device 10, the user can program various inputs thereto for choosing whether differential or single-ended operation is desired. In response to an input indicating single-ended operation, the timing as shown in FIG. 2 does not change, but rather various input switches are responsive to either single or differential operation. For example, the phase 3 switch 72 is operable only during differential operation, and not during single-ended operation. In contrast, phase 3 switches 64 and 68 are responsive only to single-ended operation during phase 3, and not responsive to differential operation. Moreover, during single-ended operation, it is assumed that the analog signals to be converted are applied to input 56, and ADC input 58 can either remain externally open-circuited, or can be connected to ground via the optional switch 59.

In single-ended operation, the noninverting input 34 of the comparator 28 remains at the common mode voltage of about 0 volts, much like that described above in connection with the differential operation of the ADC device 10. Further, assuming a single-ended analog voltage of +5 volts is applied to input terminal 56, the conversion to corresponding digital signals is carried out in the following manner. Initially, phase 1 switches 42 and 44 are closed so that the comparator 28 operates in a unity gain configuration with high open-loop gain to provide sampling of the single-ended analog input voltage. The input analog voltage is applied to plate 66 of input capacitor 52 by way of the closed phase 2 switch 54. Although the phase 2 switch 60 is also closed, no analog voltage is applied to such ADC input. Those skilled in the art may choose to utilize a switch connected from the ADC input terminal 58 to ground, and close such switch during a single-ended operation of the ADC device 10. At time $T_3$ (FIG. 2), the phase 1 switches open, as do the phase 2 switches. The phase 3 switches, except for switch 72, then operate, in which event three things occur. First, the phase 3 switches 78 and 80 close to thereby reduce the gain of the comparator 28 and thereby increase the speed by which the comparison occurs. Secondly, phase 3 switch 46 closes so that the common mode voltage on comparator output 36 is coupled to the noninverting comparator input 34. As noted above, in the preferred form of the invention, the common mode voltage selected is 0 volts, although other voltages may be selected to satisfy other constraints. Thirdly, the phase 3 switch 64 closes, thereby transferring the +5 volts stored on input capacitor 52 to the inverting input 30 of the comparator 28. When the plate 66 of the input capacitor 52 is grounded by the phase 3 switch 64, −5 volts is transferred to the inverting input 30 of the comparator 28.

In the single-ended operation, the phase 3 switch 72 does not close, and thus the input capacitors 52 and 62 are not placed in series, as was done in the differential mode of operation. In the differential mode, the series-connected input capacitors 52 and 62 together thus represent half the composite capacitance of the capacitors 52 and 62. In contrast, for single-ended operation, the value of capacitor 52 is not otherwise reduced, and thus it is of the same value as the capacitor 50 associated with the DAC 20. The charge sharing in the single-ended operation is thus between the equal-value capacitors 50 and 52. As such, if the analog voltage at the inverting input 30 of the comparator 28 is +5 volts $+V_{offset}$, in order to switch the output 32 of the comparator 28, the capacitor 50 need only couple a voltage of equal magnitude and opposite polarity, as compared to the voltage on the comparator input 30. With this arrangement, the full dynamic range of the ADC device 10 is utilized in the single-ended mode. The conversion process is carried out in the same manner noted above, where the SAR circuit 12 carries out an iteration of different digital values which, when converted to corresponding analog reference voltages, approach the magnitude of the voltage on the inverting input 30 of the comparator 28.

A Table of the comparison during single-ended operation and the differential operation of the ADC device 10 is set forth below.

TABLE 1

Differential Operation

| Input Analog Voltage | | Digital Output (2's Complement) |
|---|---|---|
| Minimum | −Vref | 1000 . . . 0 |
| Maximum | +Vref | 0111 . . . 1 |

Single-Ended Operation

| Input Analog Voltage | | Digital Output (Unsigned Magnitude) |
|---|---|---|
| Minimum | 0 volts | 0000 . . . 0 |
| Maximum | +Vref | 1111 . . . 1 |

As can be seen by the foregoing Table 1, the full dynamic range of the ADC device 10 is utilized in both the differential and the single-ended operation. This advantage is realized even though the input voltage range in the differential mode is twice that of the input voltage range during the single-ended mode of operation. It can be appreciated that the full dynamic range of the ADC device 10 is utilized by way of the arrangement in which the input capacitors 52 and 62 are configured during the different modes of operation. It can also be appreciated that only a single DAC 20 need be employed, because the noninverting input 34 of the comparator 28 is always maintained at a common mode voltage during both modes of operation. An efficient and cost effective ADC device 10 is thereby achieved.

In FIG. 3, there is illustrated another embodiment of the ADC device 100 constructed according to the principles and concepts of the invention. Included within this ADC device 100 is a programmable gain circuit 102 which constitutes a number of switched capacitors for providing different capacitance values connected to the inverting input 30 of the comparator 28. The switched capacitors 102 can effectively provide a variable capacitor 50 in connection with the ADC device 10 shown in FIG. 1. As shown in FIG. 3, the input capacitors 52 and 62 are of identical value, designated nominally by the value "C". In practice, the value of input capacitors 52 and 62 are about 5 pf. The capacitance values of the programmable gain circuit 102, includes various values of a nominal value "C'". In this example, C=16 C'.

The output 22 of the DAC 20 is coupled to a number of switches 104, each connected in series with a respective capacitor 106. The switches 104 can selectively be closed by the SAR control 14 to place the various capacitors 106 in parallel with each other. A plate of each capacitor 106 is connected in common to a conductor 108 which is connected to the inverting input 30 of the comparator 28. In the example, there are six capacitors 106 with respective values C', C', 2 C', 4 C', 8 C' and 16 C'. The respective switches 104 are effective to couple one or more of the capacitors 106 between the DAC output 22 and the inverting input 30 of the comparator 28. When so connected, the switches are considered "on". Switches 104 are also switchable for connecting one plate of each capacitor 106 to ground. When so connected, the switch position is considered "GND". The Table II set forth below lists the various combinations of capacitors 106 and the switch settings 104 in order to produce different programmable gains. The various combination of gains can be one-half, 1, 2, 4, 8, or 16. The gain of one-half is made available for users of the ADC device 100 when input signals are greater in magnitude than the reference voltage produced at the output 22 of the DAC 20. As can be seen from TABLE 2, the less capacitance that is switched on, the greater the gain.

TABLE 2

PROGRAMMABLE GAIN-SWITCH CONNECTION

| Gain | 16C' | 8C' | 4C' | 2C' | 1C' | 1C' |
|---|---|---|---|---|---|---|
| ½ | ON | ON | ON | ON | ON | ON |
| 1 | GND | ON | ON | ON | ON | ON |
| 2 | GND | GND | ON | ON | ON | ON |
| 4 | GND | GND | GND | ON | ON | ON |
| 8 | GND | GND | GND | GND | ON | ON |
| 16 | GND | GND | GND | GND | GND | ON |

Although the preferred embodiment has been described in detail, it should be understood that various changes, substitutions and alterations can be made therein without departing from the spirit and scope of the invention as defined by the appended claims.

What is claimed is:

1. A programmable gain circuit for an analog-to-digital converter, comprising:
   a sampling capacitor for storing a sample of a voltage representative of an analog signal to be converted to a corresponding digital signal;
   a comparator circuit for comparing said sampled voltage with a reference analog signal;

a digital-to-analog converter (DAC) for generating said reference analog signal; and a switched capacitor circuit, including a plurality of switched capacitors coupled between an output of said DAC and an input circuit of said comparator, wherein a desired gain can be achieved as a function of a switched arrangement of said switched capacitors.

2. The programmable gain circuit of claim 1, wherein said switched capacitor circuit is coupled to said sampling capacitor so that electrical charge is shared therebetween.

3. The programmable gain circuit of claim 2, wherein an output of said switched capacitor circuit is connected to one plate of said sampling capacitor.

4. The programmable gain circuit of claim 3, wherein an input of said comparator is coupled to a junction between said sampling capacitor and said switched capacitor circuit.

5. The programmable gain circuit of claim 1, further including a switch arrangement for switching said switched capacitors in parallel to thereby change the gain of the analog-to-digital converter.

6. The programmable gain circuit of claim 5, wherein said switched capacitors are switched to increase a total capacitance of the switched capacitor circuit to lower the gain of the analog-to-digital converter.

7. The programmable gain circuit of claim 6, wherein said switched capacitors have different capacitances to provide corresponding different gains.

8. The programmable gain circuit of claim 1, further including a switch for connecting one terminal of said sampling capacitor to a circuit common voltage to thereby couple an inverted polarity analog signal amplitude for comparison by said comparator.

9. The programmable gain circuit of claim 1, further including a second sampling capacitor so that differential analog signal amplitudes can be sampled, and further including a switch for connecting said sampling capacitors in series.

10. A method of providing gain in an analog-to-digital converter circuit, comprising the steps of:

coupling an analog signal amplitude via an input capacitor to a node;

coupling an analog reference via a switched capacitor network to said node;

comparing a voltage representative of the voltage of said node with a second voltage to produce a digital signal; and switching a number of capacitors in said switched capacitor network to vary a capacitance thereof for adjusting the magnitude of the analog reference relative to the magnitude of the analog signal amplitude at said node.

11. The method of claim 10, wherein said switched capacitor network includes a plurality of capacitors and a plurality of switches to connect two or more said switched capacitors in parallel.

12. The method of claim 11, further including increasing the capacitance of said switched capacitor network to lower the gain of the analog-to-digital converter circuit.

13. The method of claim 10, further including AN SAR responsive to said digital signal for producing a digital word, and, for a given analog signal amplitude, switching in additional capacitances in said switched capacitor network to thereby require a larger magnitude analog reference coupled via said switched capacitor network to said node, thereby requiring a derivation of a larger value digital word.

14. The method of claim 10, wherein said input capacitor defines a first capacitor, and further including coupling differential analog amplitudes to respective first and second input capacitors, and connecting said first and second input capacitors in series.

15. The method of claim 14, wherein said first and second input capacitors are of substantially equal capacitance value.

16. The method of claim 10, further including applying said digital signal to a successive approximation register circuit to derive a digital word corresponding to said analog signal amplitude.

17. The method of claim 10, further including connecting one terminal of said input capacitor to a common voltage to thereby couple an inverted polarity analog signal amplitude to said node.

18. A programmable gain circuit for an analog-to-digital converter, comprising:

a comparator circuit for generating a digital signal as a function of voltages applied to inputs thereof;

at least one input capacitor for transferring an analog signal amplitude to a node for comparing by said comparator;

a digital-to-analog converter for generating a reference voltage as a function of a digital word input thereto; and a switched capacitor network including a plurality of capacitors, and a plurality of switches for activating and deactivating ones of said switched capacitors, a first terminal of said switched capacitor network driven by said reference voltage, and a second terminal of said switched capacitor network driving said node, whereby for effective larger capacitances generated by said switched capacitor network a smaller reference voltage is required to drive said switched capacitor network to produce a voltage at said node substantially equal in magnitude to said analog signal amplitude, thereby effectively lowering the gain of said analog-to-digital converter.

19. The programmable gain circuit of claim 18, wherein said switched capacitor network drives said node with a signal polarity opposite that applied to said node by said input capacitor.

20. The programmable gain circuit of claim 19, further including a switch coupled to said input capacitor and operable for causing a sampled voltage stored by said input capacitor to be inverted in polarity when transferred to said node.

21. The programmable gain circuit of claim 18, further including an arrangement of switched capacitors and switches for providing a gain of less than unity.

* * * * *